United States Patent

Bushey et al.

Patent Number: 5,828,607
Date of Patent: Oct. 27, 1998

[54] MEMORY PROGRAMMING CIRCUIT AND METHOD

[75] Inventors: Thomas P. Bushey, Phoenix; James S. Caravella; Jeremy W. Moore, both of Chandler, all of Ariz.

[73] Assignee: Motorola, Inc.

[21] Appl. No.: 861,078

[22] Filed: May 21, 1997

[51] Int. Cl.⁶ .............................. G11C 7/00; G11C 16/04
[52] U.S. Cl. ................................ 365/189.11; 365/185.18; 365/226
[58] Field of Search ........................ 365/189.11, 185.18, 365/226, 185.29, 185.27; 327/536

[56] References Cited

U.S. PATENT DOCUMENTS

| | | |
|---|---|---|
| 5,557,568 | 9/1996 | Miyamoto et al. . |
| 5,600,592 | 2/1997 | Atsumi et al. ....................... 365/185.18 |
| 5,617,359 | 4/1997 | Ninomiya ............................ 365/185.29 |
| 5,619,449 | 4/1997 | McIntyre ......................... 365/185.18 X |
| 5,663,907 | 9/1997 | Frayer et al. ........................ 365/185.18 |
| 5,666,309 | 9/1997 | Peng et al. ...................... 365/185.18 X |

OTHER PUBLICATIONS

K. Sawada et al., Nippon Steel Corporation, "An On–Chip High–Voltage Generator Circuit for EEPROMs with a Power Supply Voltage Below 2V", 1995 Symposium on VLSI Circuits Digest of Technical Papers, pp. 75–76.

Primary Examiner—Huan Hoang
Attorney, Agent, or Firm—Robert F. Hightower; Robert D. Atkins

[57] ABSTRACT

A circuit and method modify data stored in a storage element (30) of a memory circuit (110) when high voltages used for such modification exceed transistor breakdowns. A charge pump (302) produces a pumped voltage ($V_{P1}$) for modifying the data. A monitor circuit (304) produces an enable signal ($V_{PEN}$) to activate other power supply voltages when the pumped voltage reaches a predetermined voltage level for allowing the data to be modified. A routing circuit (832) selects between the pumped voltage and a first voltage ($V_{DD}$) in response to a first control signal (HVENABLEP) to produce a selected voltage. A switching circuit (802–808) passes the selected voltage to the storage element (30) to modify the data when the first supply voltage is selected by the routing circuit.

17 Claims, 6 Drawing Sheets

MEMORY PROGRAMMING CIRCUIT AND METHOD

CROSS REFERENCE TO RELATED PATENT APPLICATIONS

The present application is related to copending U.S. patent application Ser. No. 08/861,406, Attorney's Docket SC10169C, entitled "Memory Power Supply Circuit and Method", filed May 21, 1997, by "Caravella, et al.," and assigned to the same assignee, Motorola Inc.

BACKGROUND OF THE INVENTION

The present invention relates in general to memory circuits, and more particularly to high voltage power supplies for programming nonvolatile memory circuits.

Wireless communications systems are presently using digital techniques to increase functionality and noise immunity while reducing cost. For example, cellular telephones and pagers receive radio frequency carrier signals modulated With digital data. A digital signal processor receives the digital data from a demodulator and executes a preprogrammed software algorithm to convert the data to audio and display signals. The preprogrammed software algorithm, as well as control signals, downloaded data, and the like, typically are stored in a nonvolatile memory.

When such wireless communications devices are for portable use, the nonvolatile memory circuit must operate from a low level battery, e.g., 1.8 volts, and have minimum current drain in order to extend the operating time between battery recharges. In addition, the die size of the nonvolatile memory circuits should be kept as small as possible in order to control manufacturing cost.

Nonvolatile memory circuits often use electrically erasable, floating gate transistors as storage elements. Stored data is modified by applying high voltage signals to induce a tunneling current through a gate dielectric which results in charging the floating gate to a predetermined potential to alter the transistor's conduction.

Prior art memory circuits are fabricated on a high voltage transistor process to prevent the high voltages from breaking down the programming transistors. A problem with such processes is that the high voltage transistors consume a larger die area than transistors fabricated on a low voltage process, which increases the cost of the memory circuit. Moreover, the larger devices are slower and have higher conduction thresholds, which reduces speed and results in poor performance when powered from a 1.8 volt battery.

Hence, there is a need for a nonvolatile memory circuit in which high voltage programming signals can be controlled by small, low voltage transistors, thereby reducing die size and cost while improving low voltage operation and performance.

DETAILED DESCRIPTION OF THE DRAWINGS

Figure 1:
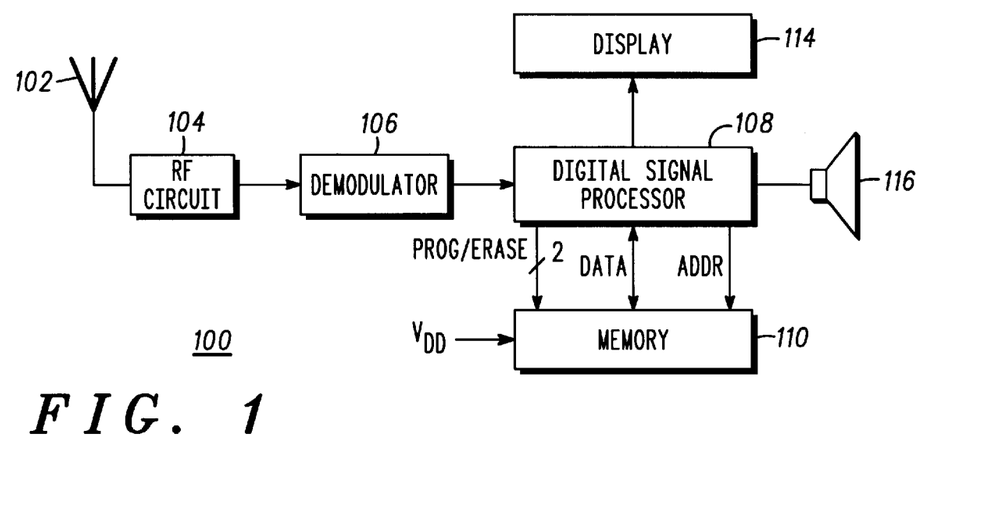
FIG. 1 is a block diagram of a wireless communications device.

FIG. 1 shows a block diagram of a wireless communications device 100 such as a cellular telephone, two-way radio or pager. A receiver circuit in communications device 100 includes an antenna 102, a radio frequency (RF) circuit 104 and a demodulator 106. Antenna 102 receives a transmitted RF carrier signal modulated with digital information. RF circuit 104 amplifies the RF carrier signal and converts the frequency down to an intermediate frequency (IF) signal which is applied to an input of demodulator 106. Demodulator 106 extracts the digital information from the IF signal to produce baseband digital data which is applied to an input of a digital signal processor (DSP) circuit 108.

DSP 108 operates under the control of software program instructions which are stored in a nonvolatile memory circuit 110 operating from a battery supply $V_{DD}$=1.8 volts. The software is addressed by sending an ADDR logic signal to memory circuit 110. Transfers of DATA between DSP 108 and memory circuit 110 are made using a data bus. A PROG/ERASE signal is transferred on two conductors such that one conductor carries a PROG logic signal to control when selected memory cells are programmed and the other conductor carries an ERASE logic signal to control when selected memory cells are erased. DSP 108 produces video and control signals for driving a display device 114, such as a liquid crystal display. An audio output produces audio signals for driving a speaker 116.

Figure 2:
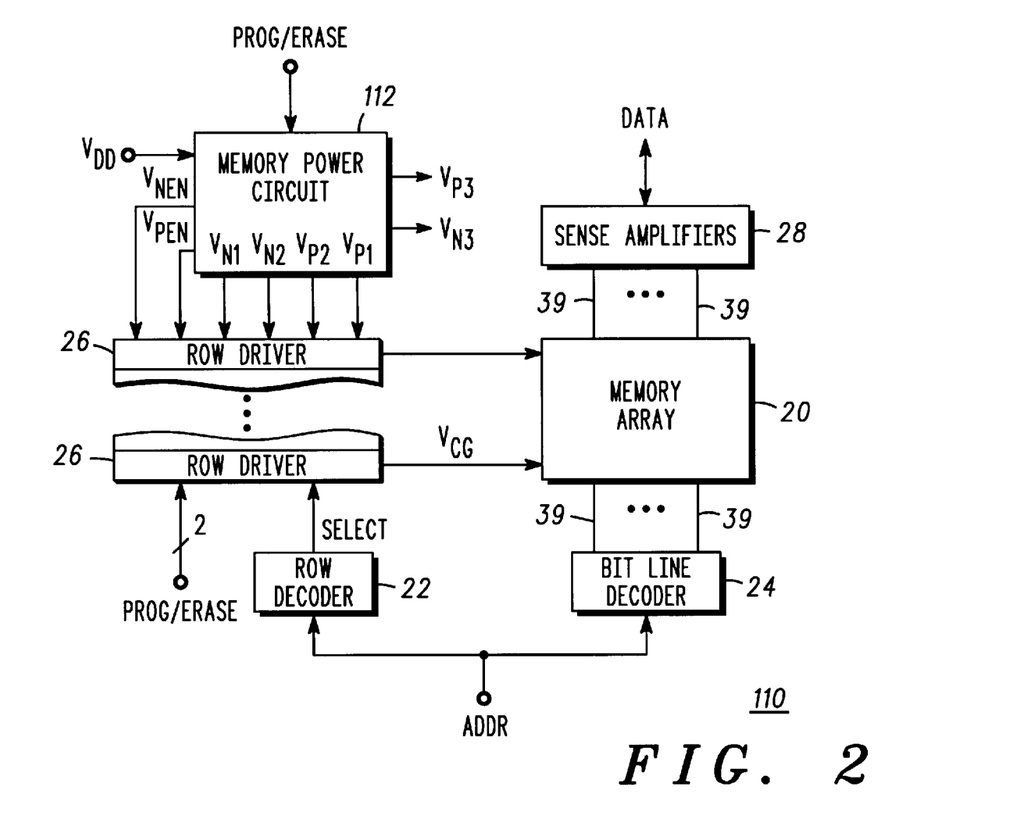
FIG. 2 is a block diagram of memory circuit.

FIG. 2 is a block diagram of memory circuit 110 including a memory array 20, a row decoder 22, a bitline decoder 24, a plurality of row drivers 26, a block of sense amplifiers 28 and a memory power circuit 112. In the figures, elements having the same reference number perform similar functions. Memory array 20 includes a plurality of memory cells organized as a matrix of addressable rows and bitlines. DATA is transferred through sense amplifiers 28 and is coupled to individual memory cells on bitlines 39 selected by bitline decoder 24. Data transfer is controlled by a read control signal (not shown) received from DSP 108.

Row decoder 22 applies a SELECT signal to activate a row driver 26. Row driver 26 receives PROG/ERASE to control a high voltage signal that couples supply voltage $V_{P1}$ or $V_{N1}$ to memory array 20 to program or erase the memory cells. Memory circuit 110 erases memory cells in blocks and programs memory cells individually or by row. Both erasing and programming modify data stored in a memory cell. For example, erasing can modify a cell to a logic zero state and programming can modify a cell to a logic one state.

$V_{P1}$ and $V_{N1}$ typically are generated with charge pumps integrated on a semiconductor die with memory power circuit 112. $V_{P2}$=$V_{P3}$=5.5 volts are biasing voltages derived from $V_{P1}$. $V_{N2}$=$V_{N3}$=−5.0 volts are biasing voltages derived from $V_{N1}$.

Figures 3, 4:
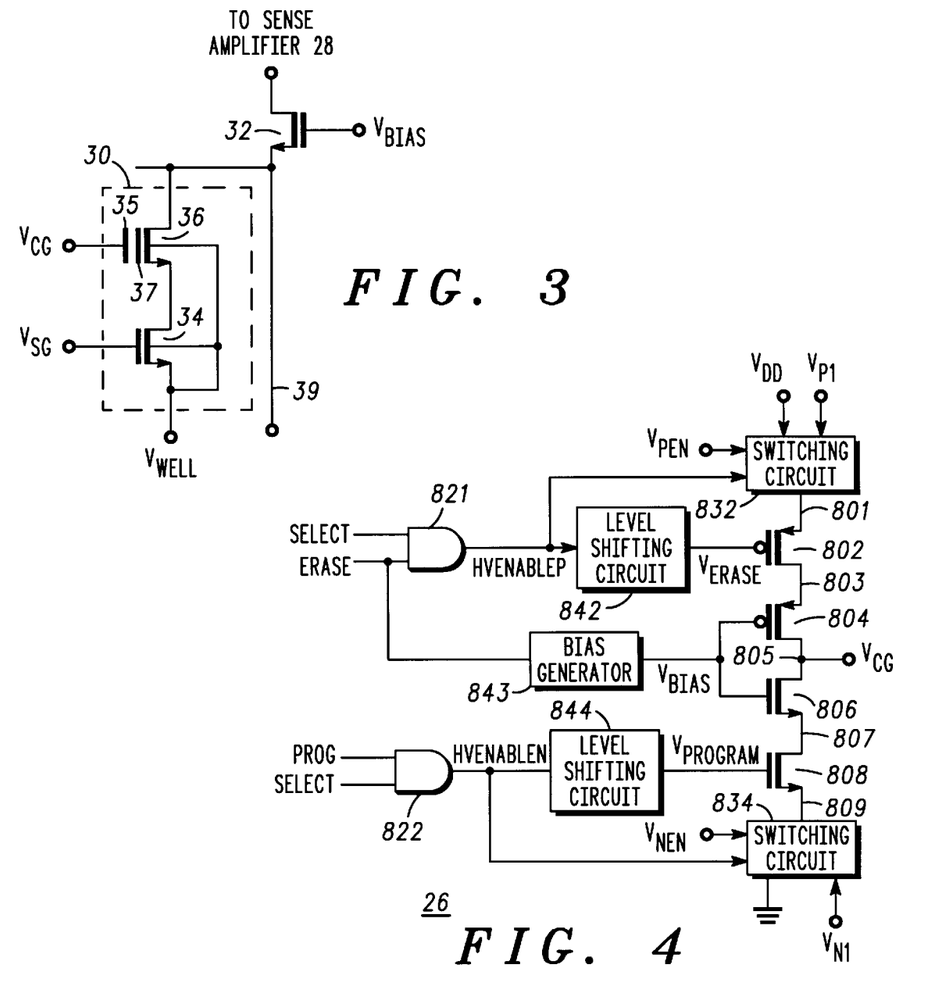
FIG. 3 is a schematic diagram of a nonvolatile memory cell.
FIG. 4 is a schematic diagram of an output buffer stage of a row driver.

FIG. 3 is a schematic diagram of a nonvolatile memory cell 30, including transistors 34 and 36, and a bitline transistor 32. Transistor 36 is a floating gate transistor operating as a storage element. Transistors 34 and 36 are disposed in a p-well biased to a voltage $V_{WELL}$ whose magnitude depends on the operating mode of memory cell 30 as described below. Select transistor 34 enables a conduction path in memory cell 30 in response to a control signal $V_{SG}$ for reading stored data. When memory cell 30 is being erased or programmed, or when memory cell 30 is not selected, transistor 34 blocks conduction to reduce power drain due to leakage currents of transistor 36. In an alternative embodiment, a memory cell can be comprised of a single floating gate transistor. As a further alternative, a memory cell can be implemented with the select transistor coupled to the drain of the floating gate transistor.

Storage transistor 36 uses a charge stored on a floating gate 37 to alter its conduction threshold. Floating gate 37 is sandwiched between dielectric layers that separate a control gate 35 from a channel of transistor 36. Under certain overprogramming conditions, transistor 36 may be operating as a depletion mode transistor which cannot be completely turned off, even when memory cell 30 is deselected. Such conduction does not result in excess power consumption because transistor 34 is switched off by $V_{SG}$ to block conduction. The drain of storage transistor 36 is coupled to a bitline 39, which transfers DATA into and out of memory cell 30.

Bitline transistor 32 is coupled to a bitline 39 and to other memory cells in a column of memory array 20 for transferring data between bitline 39 and a sense amplifier 28. In order to minimize die layout area and to fit bitline transistor 32 to the dimensions of memory cell 30, bitline transistor 32 is disposed in the array well with memory cell 30, and therefore has the same well potential $V_{WELL}$. Signal $V_{CG}$ operates as an erase signal or a programming signal. Bitline 39 has a potential $V_{BL}$. In one embodiment, the voltages applied to a selected memory cell 30 in various operating modes, $V_{CG}$, $V_{WELL}$ and $V_{BL}$, are shown in Table 1.

TABLE 1

| MODE | $V_{CG}$ | $V_{WELL}$ | $V_{BL}$ |
|---|---|---|---|
| Read | 1.8 | 0.0 | 1.2 |
| Erase | 12.8 | −5.0 | −5.0 |
| Program | −9.0 | 0.0 | 5.5 |

As shown in Table 1, high voltages are used for programming and erasing memory cell 30. In particular, $V_{CG}$=12.8 or −9.0 volts, $V_{WELL}$=−5.0 or 0.0 volts, and $V_{BL}$=−5.0 or 5.5 volts. Such high voltages exceed the source-to-drain transistor breakdown of the standard low voltage transistors in memory circuit 110, which have three volt breakdowns. $V_{P1}$, $V_{P2}$, $V_{P3}$, $V_{N1}$, $V_{N2}$, and $V_{N3}$ are considered to be high voltages for such transistors. Other transistors are capable of withstanding as much as thirteen volts from the gate to source, bulk or drain and eleven volts from drain to source. However, such transistors consume a large die area and therefore are used sparingly.

Many prior art memory circuits do not have a problem of controlling high voltages because such circuits use transistors whose breakdowns are greater than the programming and erase voltages of the memory circuit. Some processes do not have transistors which can withstand the voltages required for programming the memory cell. The present invention uses low voltage transistors to reduce die area and improve performance while using circuit techniques to control the high voltages without damaging the transistors.

FIG. 4 is a schematic diagram of row driver 26 including a cascoded driver stage comprising transistors 802 and 804, a cascoded driver stage comprising transistors 806 and 808, logic AND gates 822 and 824, level shifting circuits 842 and 844, a bias generator 843, and switches 832 and 834. Row driver 26 receives mode signals PROG and ERASE and produces memory cell control gate signal $V_{CG}$=12.8 volts (erase mode) or $V_{CG}$=−9.0 volts (programming mode) at an output. When memory circuit 110 is not in an erase or programming mode, $V_{CG}$=1.8 volts.

Logic AND gate 822 produces an enable signal HVENABLEP when SELECT is applied to row driver 26 and mode signal ERASE is valid. Logic AND gate 824 produces an enable signal HVENABLEN when row driver 26 is selected and when mode signal PROG is valid. $V_{PEN}$ combines with HVENABLEP to control switch 832 to allow data stored in a selected memory cell 30 to be erased once $V_{P1}$ and $V_{P2}$ reach levels sufficient to bias transistors 802–808 for switching without damage. $V_{NEN}$ combines with HVENABLEN to control switch 834 to allow data to be programmed once $V_{N1}$ and $V_{N2}$ reach levels adequate to bias transistors 802–808 for switching without damage. Logic AND gates 822 and 824 operate as low voltage gates such that HVENABLEP and HVENABLEN operate at logic zero and logic one levels of zero and $V_{DD}$=1.8 volts, respectively.

Level shifting circuit 842 level shifts HVENABLEP to produce a drive signal $V_{ERASE}$ referenced to $V_{P1}$ to provide gate drive to switch transistor 802. Level shifting circuit 844 level shifts HVENABLEN to produce a drive signal $V_{PROGRAM}$ referenced to $V_{N1}$ to provide gate drive for switching transistor 808. Hence, $V_{ERASE}$ switches between 0.0 and 12.8 volts and $V_{PROGRAM}$ switches between 1.8 and −9.0 volts. In an alternative embodiment, $V_{ERASE}$ can be referenced to node 801 and $V_{PROGRAM}$ can be referenced to node 809.

During the erase mode, switch 832 is controlled by HVENABLEP for routing $V_{P1}$ to node 801 for passing $V_{P1}$ to memory cell 30 as $V_{CG}$ to erase memory cell 30. Switch 832 routes $V_{DD}$ to node 801 at other times. During the programming mode, switch 834 is controlled by HVENABLEN to couple node 809 to $V_{N1}$ for passing $V_{N1}$ to memory cell 30 as $V_{CG}$ to program memory cell 30. Switch 834 routes ground potential to node 809 at other times. Switches 832 and 834 include level shifters to interface between low voltage logic levels (ground and $V_{DD}$) and the high voltage references $V_{P1}$ and $V_{N1}$.

Transistors 802–808 can withstand eleven volts being applied to their respective terminals without incurring damage. Under DC conditions, neither transistors 802–808 nor switches 832–834 are subjected to voltages sufficient to cause a breakdown when configured as described. However, under transient or power up conditions, the instantaneous voltage appearing across specific transistors is unpredictable. Without switching circuits 832 and 834 to block $V_{P1}$ and $V_{N1}$ during supply transitions, $V_{P1}$ and $V_{N1}$ could be applied simultaneously across transistors 802–808, damaging the devices. To alleviate this problem, $V_{P2}$ and $V_{N2}$ are sequenced from $V_{P1}$ and $V_{N1}$ to allow $V_{P1}$ and $V_{N1}$ to be charge pumped to predetermined voltage levels before $V_{P2}$ and $V_{N2}$ are enabled.

Bias generator 843 applies a bias voltage $V_{BIAS}$ to the gates of transistors 804–806 which follows the voltage levels between nodes 801 and 809. Level shifting circuits 842 and 844 and bias generator 843 operate whether or not charge pumps 302 and 308 are active. Row driver 26 therefore can maintain a read bias whether or not charge pumps 302 and 308 are active. The voltages at particular points of row driver 26 are shown in Table 2 below.

TABLE 2

| SIGNAL | READ MODE (Low Voltage) | ERASE MODE | PROGRAM MODE | READ MODE (High Voltage) |
|---|---|---|---|---|
| $V_{P1}$ | 1.8 | 13.0 | 13.0 | 13.0 |
| $V_{PEN}$, $V_{NEN}$ | 0.0 | 1.8 | 1.8 | 1.8 |
| node 801 | 1.8 | 13.0 | 1.8 | 1.8 |
| node 803 | 1.8 | 13.0 | −5.0 | 1.8 |
| node 807 | 0.0 | 5.5 | −9.0 | 0.0 |
| node 809 | 0.0 | 0.0 | −9.0 | 0.0 |
| $V_{N1}$ | 0.0 | −9.0 | −9.0 | −9.0 |
| $V_{BIAS}$ | 0.0 | 5.5 | −5.0 | −5.0 |
| $V_{PROGRAM}$ | 0.0 | −9.0 | −1.8 | −9.0 |
| $V_{ERASE}$ | 0.0 | 0.0 | 13.0 | 0.0 |
| $V_{CG}$ | 1.8 | 13.0 | −9.0 | 1.8 |

Figure 5:
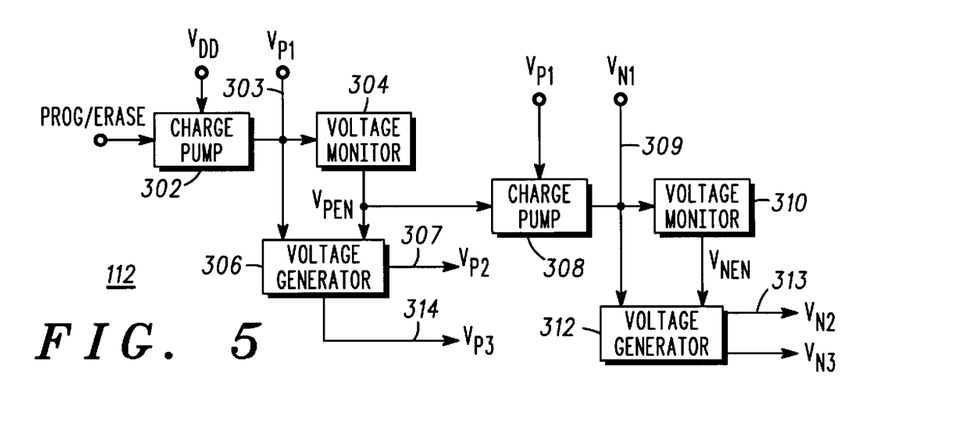
FIG. 5 is a block diagram of a memory power circuit.

FIG. 5 shows memory power circuit 112 and the implementation of the supply sequencing described previously. Memory power circuit 112 includes charge pumps 302 and 308, voltage monitor circuits 304 and 310, and voltage generators 306 and 312. Charge pumps 302 and 308 are standard charge pumps integrated on the same die with memory circuit 110. Charge pump 302 produces a pumped voltage $V_{P1}$=12.8 volts at an output 303 and charge pump 308 produces a pumped voltage $V_{N1}$=−9.0 volts at an output 309. The magnitude of $V_{P1}$ is sensed or clamped to ensure a minimum voltage equal to $V_{DD}$. Hence, $V_{P1}$ ranges from 1.8 volts when inactive to 12.8 volts when active. Charge pumps 302 and 308 operate from $V_{DD}$=1.8 volts. $V_{N1}$ is referenced to $V_{P1}$ by clamping $V_{N1}$ with a junction having a breakdown voltage of 21.8 volts. Alternatively, charge pumps 302 and 308 can include voltage regulators referenced to an internally generated voltage reference to set the respective amplitudes of $V_{P1}$ and $V_{N1}$.

To conserve power for portable or battery operation, charge pumps 302 and 308 are enabled only during the erase and programming modes by using PROG/ERASE to enable charge pump 302. The time needed to pump $V_{P1}$ and $V_{N1}$ to full amplitude typically exceeds several microseconds because of a large load capacitance on nodes 303 and 309. Alternatively, in applications where memory circuit 110 is reprogrammed frequently, pumped voltages $V_{P1}$ and $V_{N1}$ can be provided continuously.

Voltage generator 306 produces bias voltages $V_{P2}$=5.5 volts at output 307 and $V_{P3}$=5.5 volts at output 314 which are derived from $V_{P1}$. Voltage generator 312 produces a bias voltage $V_{N2}$=−5.0 volts and $V_{N3}$=−5.0 volts which are derived from $V_{N1}$. Voltage generators 306 and 312 are respectively enabled by enable signals $V_{PEN}$ and $V_{NEN}$, which operate at standard logic levels.

In order to avoid damage to row driver 26 caused by a large power up transient voltage exceeding transistor breakdown voltages, $V_{P1}$, $V_{P2}$, $V_{P3}$, $V_{N1}$, $V_{N2}$ and $V_{N3}$ are powered up in a particular sequence controlled by voltage monitor circuits 304 and 310. Voltage monitor circuits 304 and 310 produce enable signals $V_{PEN}$ and $V_{NEN}$ when pumped voltages $V_{P1}$ and $V_{N1}$ reach voltage levels sufficient to safely generate $V_{P2}$, $V_{P3}$ $V_{N2}$ and $V_{N3}$. For example, voltage monitor circuit 304 produces enable signal $V_{PEN}$ when pumped voltage $V_{P1}$ reaches a predefined voltage level such as seven volts. Voltage monitor circuit 310 produces enable signal $V_{NEN}$ when the magnitude of pumped voltage reaches a predefined voltage level such as minus seven volts.

Figures 6, 7, 8:
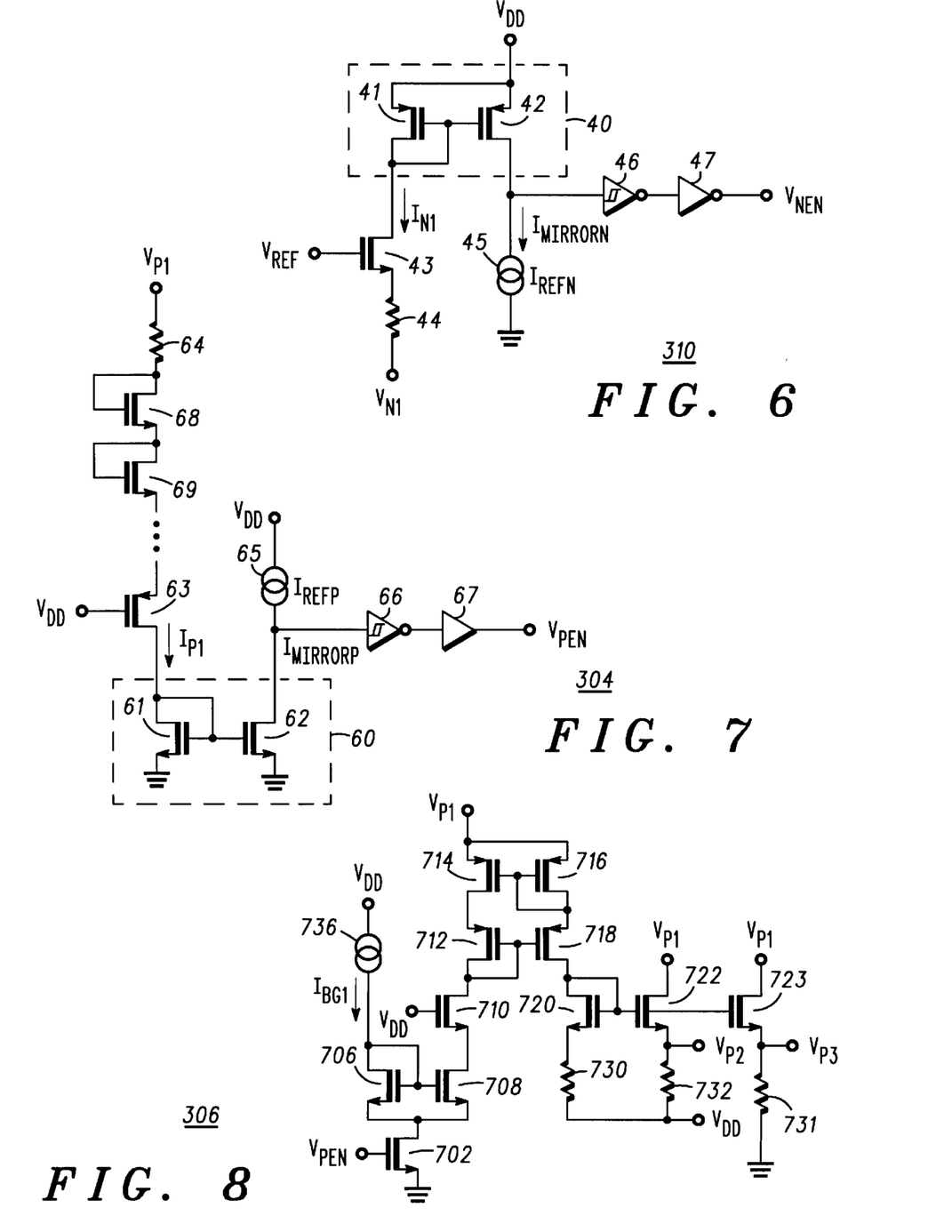
FIG. 6 is a schematic diagram of a voltage monitor circuit.
FIG. 7 is a schematic diagram of another voltage monitor circuit.
FIG. 8 is a schematic diagram of a voltage generator.

FIG. 6 is a schematic diagram of voltage monitor circuit 310, including a current mirror 40 comprised of matching or scaled PMOS transistors 41 and 42. Voltage monitor circuit 310 further includes a transistor 43, a resistor 44, a current source 45, a comparator 46 and an output buffer 47. The gate of transistor 43 is coupled to a reference voltage V which can be set to ground potential. Current $I_{N1}$ flows out of transistor 41 as determined by the amplitudes of $V_{N1}$ and $V_{REF}$, the value of resistor 44, and the conduction threshold of transistor 43. Transistor 42 is matched to transistor 41 so that $I_{MIRRORN}$, the drain current of transistor 42, is a fixed multiple of $I_{N1}$.

Current source 45 produces a reference current $I_{REFN}$ that tracks $I_{N1}$ over the expected range of manufacturing process variations. That is, $I_{REFN}$ is designed such that variations in resistor 44 and the conduction threshold of transistor 43 equally affect $I_{REFN}$ and $I_{N1}$. The magnitude of $I_{REFN}$ is set so that comparator 46 switches when $V_{N1}$ reaches a predefined voltage level, e.g., $V_{N1}$=−7.0 volts. Due to the large capacitive load on charge pump 308, several microseconds may be needed for $V_{N1}$ to reach the predefined voltage level.

Comparator 46 operates as an inverting Schmitt trigger including built-in hysteresis to increase noise immunity and reduce false triggering due to the slow rise time of $V_{N1}$. A hysteresis voltage of 200.0 millivolts typically is adequate to prevent programming errors in memory cell 30 caused by incorrect voltage levels. Buffer 47 is designed to have a high capacitance drive capability.

In operation, as the magnitude of $V_{N1}$ increases, $I_{N1}$ and $I_{MIRRORN}$ increase proportionately. After several microseconds, when $I_{MIRRORN}$ reaches the magnitude of $I_{REFN}$, comparator 46 switches to produce enable signal $V_{NEN}$ at the output at standard logic levels.

A similar voltage monitor circuit can be used when a read operation is performed after programming a logic zero to monitor array well potential $V_{WELL}$. As shown in Table 1, $V_{WELL}$=−5.0 volts during an erase. Considerable time may be needed for $V_{WELL}$ to discharge to zero volts for reading cell 30. A premature read often produces incorrect data or even device damage.

FIG. 7 is a schematic diagram of voltage monitor circuit 304, including a current mirror 60 comprised of matching or scaled NMOS transistors 61 and 62. Further included are a transistor 63, a resistor 64, a current source 65, a comparator 66 and an output buffer 67. A string of diode-configured transistors, including transistors 68 and 69, form a diode string which reduces the voltage applied to transistor 63 and allows resistor 64 to be implemented with a smaller resistance. Although the diode string is shown as having two diode-configured transistors 68 and 69, it is understood that a larger or smaller number can be used, depending on the desired trip voltage level of voltage monitor circuit 304, the conduction thresholds of transistors 68, 69, etc., and the like.

The gate of transistor 63 is coupled to $V_{DD}$ or other suitable reference voltage. Current $I_{P1}$, the current into transistor 61, is determined by the amplitudes of $V_{P1}$ and $V_{DD}$, the value of resistor 64, and the conduction threshold of transistor 63. Transistor 63 has a breakdown of eleven volts. Transistor 62 is matched to transistor 61 so that $I_{MIRRORP}$, the drain current of transistor 62, is a fixed multiple of $I_{P1}$.

Current source 65 produces a reference current $I_{REFP}$ that is proportional to $I_{P1}$, and therefore $V_{P1}$, over the range of manufacturing process variations. The magnitude of $I_{REFP}$ is set so that comparator 66 switches when $V_{P1}$ reaches a predefined voltage level, e.g., $V_{P1}$=7.0 volts. Comparator 66 includes 200.0 millivolts of hysteresis.

In operation, as the magnitude of $V_{P1}$ increases, $I_{P1}$ and $I_{MIRRORP}$ increase proportionately. After several microseconds, when $I_{MIRRORP}$ equals $I_{REFP}$, comparator 66 changes state and produces enable signal $V_{PEN}$ at the output. Buffer 67 is a non-inverting driver circuit designed to drive a high capacitance.

FIG. 8 is a schematic diagram of voltage generator 306, comprising transistors 702–723, resistors 730–732 and a current source 736. When enabled ($V_{PEN}$ high), voltage generator 306 generates bias voltages $V_{P2}$=5.5 volts and $V_{P3}$=5.5 volts from a reference current $I_{BG}$ produced by current source 736 and derived from a bandgap or similar regulator (not shown). The regulator is typically integrated on the die with memory circuit 110. Resistors 730 and 732 are coupled to $V_{DD}$ as shown to ensure that $V_{P2}$ does not fall below $V_{DD}$ even when voltage generator 306 is disabled by $V_{PEN}$ or when charge pump 302 is inactive. Resistor 731 is coupled to ground potential so that $V_{P3}$=0.0 volts when charge pump 302 is inactive. Inverter 740 and transistor 702 operate as a switch that couples node 762 to $V_{DD}$ to turn on transistor 702 for enabling voltage generator 306.

Transistor 702 is controlled by $V_{PEN}$ for providing a current path for a first current mirror comprising transistors 706 and 708 referenced to ground when $V_{PEN}$ is valid. In particular, current $I_{BG1}$ flows into diode-coupled transistor 706 and is mirrored in transistor 708. Transistors 714–716 operate as a second current mirror referenced to $V_{P1}$ that receives a current proportional to $I_{BG1}$ from the drain of transistor 708 and produces a proportional current through transistor 718 and resistor 730 to develop a potential substantially equal to $V_{P2}$ at the source of transistor 720. Transistors 710, 712 and 718 are biased as shown to operate as cascode transistors to reduce the variation of $V_{P2}$ as a function of $V_{P1}$ and to reduce the voltage across transistors 710 and 718. Transistors 720–723 operate as buffer stages biased with resistors 732 and 731 as shown to supply $V_{P2}$ at the source of transistor 722 and $V_{P3}$ at the source of transistor 731.

Voltage generator 306 is disabled by switching $V_{PEN}$ to a low logic level such that transistor 702 is turned off. The current through transistor 720 is reduced to zero, thereby maintaining $V_{P2}$ at $V_{DD}$=1.8 volts minimum.

Figure 9:
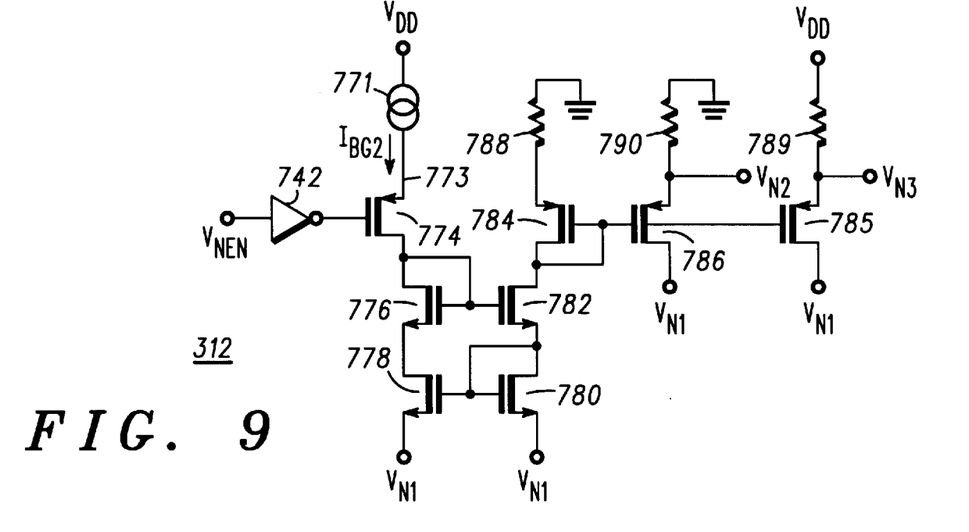
FIG. 9 is a schematic diagram of another voltage generator.

FIG. 9 is a schematic diagram of voltage generator 312, comprising transistors 772–786, resistors 788–790, a current source 771 and an inverter 742. When enabled ($V_{NEN}$ high), voltage generator 312 generates bias voltages $V_{N2}$=−5.0 volts and $V_{N3}$=−5.0 volts from a reference current $I_{BG2}$ produced by current source 771. Inverter 742 and transistor 772 operate as a switch to couple $I_{BG2}$ to a first current mirror including transistors 778 and 780 referenced to $V_{N1}$. Transistor 780 produces a proportional current through transistors 782–784 and resistor 788 to develop a potential substantially equal to $V_{N2}$ across resistor 788. Transistors 776 and 782 operate as cascode transistors to reduce the variation of $V_{N2}$ as a function of $V_{N1}$ and to reduce the voltage on transistors 772 and 778.

Transistors 784–786 comprise buffer stages biased with resistor 790 coupled to ground and resistor 789 coupled to $V_{DD}$ to supply $V_{N2}$ and $V_{N3}$ at the sources of transistors 786 and 785, respectively. Therefore, when charge pumps 302 and 308 are inactive, $V_{N2}$=0.0 volts and $V_{N3}$=1.8 volts.

Voltage generator 312 is disabled by switching $V_{NEN}$ to a low logic level to turn off transistor 772 and reduce the current flowing into transistor 776 to zero. The current through resistor 788 is thereby reduced to zero so that $V_{N2}$=0.0 volts.

Figure 10:
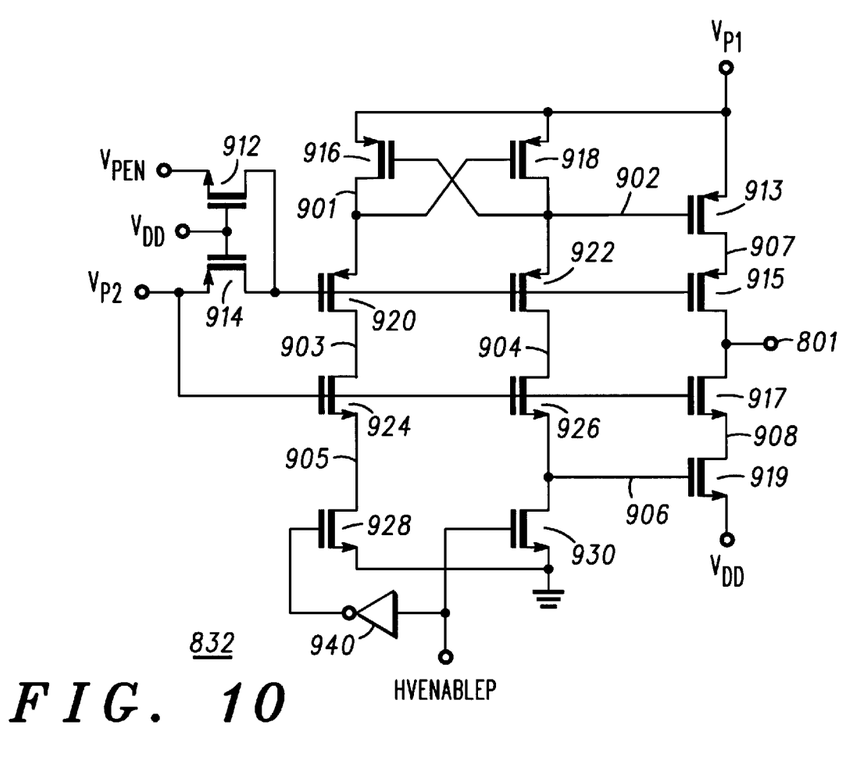
FIG. 10 is a schematic diagram of a switch.

FIG. 10 is a schematic diagram of switching circuit 832 including transistors 912–930 and an inverter 940 for routing $V_{P1}$=12.8 volts to node 801 when HVENABLEP and $V_{PEN}$ are valid (logic one). Switch 832 routes $V_{DD}$ to node 801 when either HVENABLEP or $V_{PEN}$ is at a logic zero state.

When charge pump 302 is inactive, $V_{P1}$=1.8 volts. Floating nodes are avoided and noise sensitivity is enhanced by operating transistors 912 and 914 as a cascode bias shift circuit to ensure that switching circuit 832 continues to operate. Transistor 912 grounds node 901 when $V_{PEN}$ is low. When charge pump 302 is operating, $V_{P1}$=12.8 volts. Transistor 914 couples $V_{P2}$ to the gates of transistors 915, 920 and 922 to provide a bias for cascode operation to protect transistors 920–926 from breakdown. Transistors 928 and 930 are switched by HVENABLEP to set transistors 916–918, which are cross-coupled to increase noise immunity and switching speed, to an appropriate state for driving transistor 802. Transistors 913, 915, 917, and 919 are cascoded for high voltage operation.

If $V_{P1}$ reaches 12.8 volts before $V_{P2}$ transitions to 5.5 volts, transistors in switching circuit 832 could be damaged. Therefore, $V_{P2}$ is enabled before $V_{P1}$ reaches full potential. For example, $V_{P2}$ is enabled when $V_{P1}$ reaches 7.0 volts. The delay in generating $V_{P2}$ ensures continual operation of switching circuit 832. The delay in generating $V_{P2}$ ensures continual operation of switching circuit 832 with a minimum of floating nodes as high voltage is applied.

Operation of switching circuit 832 is seen by referring to Table 3 below, which describes selected voltages in switching circuit 832.

TABLE 3

| SIGNAL | READ MODE (Low Voltage) | ERASE MODE | PROGRAM MODE | READ MODE (High Voltage) |
|---|---|---|---|---|
| $V_{P1}$ | 1.8 | 13.0 | 13.0 | 13.0 |
| $VF_2$ | 1.8 | 5.5 | 5.5 | 5.5 |
| $V_{PEN}$ | 0.0 | 1.8 | 1.8 | 1.8 |
| node 801 | 1.8 | 13.0 | 1.8 | 1.8 |
| node 901 | 1.8 | 13.0 | 5.5 | 5.5 |
| node 902 | 0.0 | 5.5 | 13.0 | 13.0 |
| node 903 | 1.8 | 13.0 | 0.0 | 0.0 |
| node 904 | 0.0 | 0.0 | 13.0 | 13.0 |
| node 905 | 1.8 | 5.5 | 0.0 | 0.0 |
| node 906 | 0.0 | 0.0 | 5.5 | 5.5 |
| node 907 | 1.8 | 13.0 | 5.5 | 5.5 |
| node 908 | 1.8 | 5.5 | 1.8 | 1.8 |
| HVENABLEP | 1.8 | 1.8 | 0.0 | 0.0 |

Figure 11:
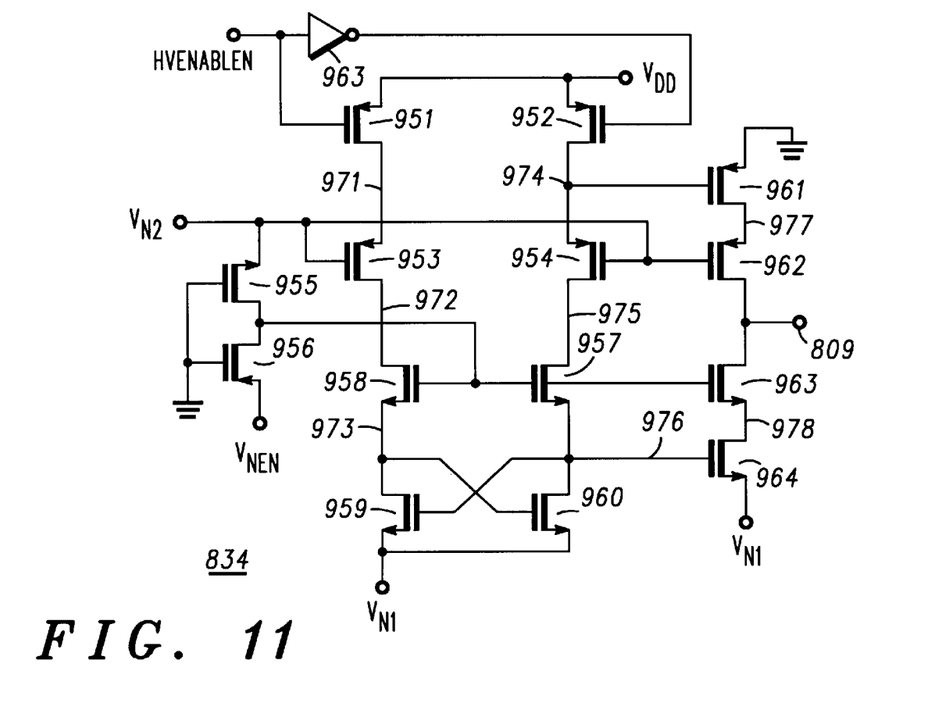
FIG. 11 is a schematic diagram of another switch.

FIG. 11 is a schematic diagram of switching circuit 834 including transistors 951–964 and an inverter 963. Switching circuit 834 couples the high voltage supply $V_{N1}$=−9.0 volts to node 809 when HVENABLEN and $V_{NEN}$ are at a logic one state and couples ground to node 809 when either HVENABLEN or $V_{NEN}$ is at a logic one state.

When charge pump 308 is inactive, $V_{N1}$=0.0 volts. Transistors 955 and 956 operate as a cascode bias shift circuit to bias transistors 957–958 and 963 to ground potential when $V_{NEN}$ is low and to $V_{N2}$ when $V_{NEN}$ is high to maintain operation of cross-coupled transistors 957–960 when charge pump 308 is inactive. HVENABLEN and $V_{NEN}$ are level shifted to produce a drive signal that is referenced to $V_{N1}$ and swings between $V_{N1}$ and ground.

When charge pump 308 is enabled, $V_{N1}$=−9.0 volts. Transistors 953–954 are biased by transistors 955 and 956 to $V_{N2}$ for cascode operation to reduce the voltages applied to transistors 953–954 and 957–958. Transistors 959 and 960 are cross-coupled to increase noise immunity and switching speed.

If $V_{N1}$ reaches −9.0 volts before $V_{N2}$ transitions to −5.0 volts, transistors in switching circuit 834 could be damaged. Therefore, voltage generator 312 is enabled for producing $V_{N2}$ before $V_{N1}$ reaches full potential. For example, $V_{N2}$ is enabled when $V_{N1}$ reaches −7.0 volts. The delay in activating $V_{N2}$ ensures continual operation of switching circuit 834 with a minimum of floating nodes as high voltage is applied.

Operation of switching circuit 834 is seen by referring to the voltage table of Table 4.

TABLE 4

| SIGNAL | READ MODE (Low Voltage) | ERASE MODE | PROGRAM MODE | READ MODE (High Voltage) |
|---|---|---|---|---|
| $V_{N1}$ | 0.0 | −9.0 | −9.0 | −9.0 |
| $V_{N2}$ | 0.0 | −5.0 | −5.0 | −5.0 |
| $V_{NEN}$ | 1.8 | 0.0 | 0.0 | 0.0 |
| node 809 | 0.0 | 0.0 | −9.0 | 0.0 |
| node 971 | 0.0 | 1.8 | −5.0 | 1.8 |
| node 972 | 0.0 | 1.8 | −9.0 | 1.8 |
| node 973 | 0.0 | −5.0 | −9.0 | −5.0 |
| node 974 | 1.8 | −5.0 | 1.8 | −5.0 |
| node 975 | 1.8 | −9.0 | 1.8 | −9.0 |
| node 976 | 1.8 | −9.0 | −5.0 | −9.0 |
| node 977 | 1.8 | 0.0 | −5.0 | 0.0 |
| node 978 | 0.0 | −5.0 | −9.0 | −5.0 |
| HVENABLEN | 1.8 | 0.0 | 1.8 | 0.0 |

Figure 12:
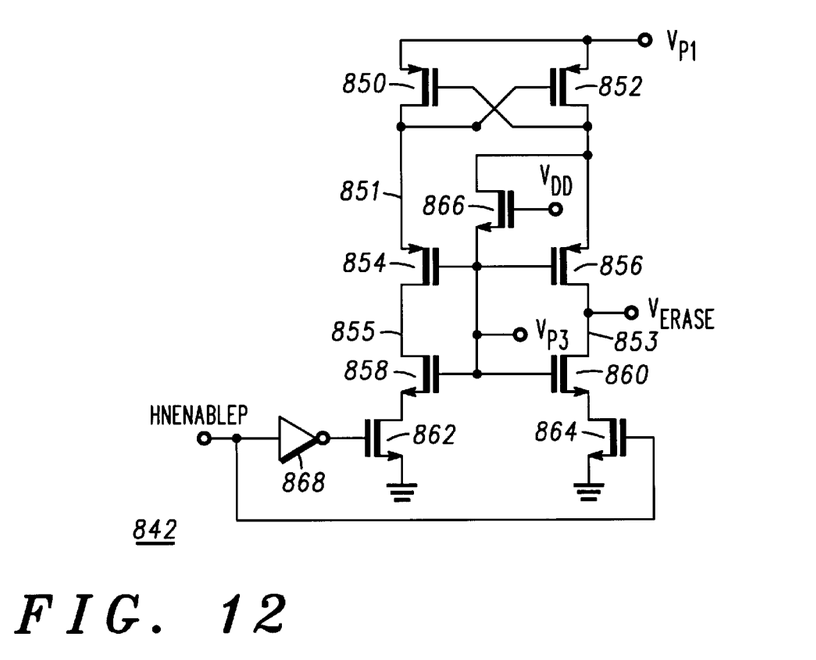
FIG. 12 is a schematic diagram of a level shifting circuit.

FIG. 12 is a schematic diagram of level shifting circuit 842 for level shifting HVENABLEP to produce switching signal $V_{ERASE}$ referenced to $V_{P1}$. Level shifting circuit 842 includes transistors 850–866 and an inverter 868, and operates between $V_{P1}$ and ground. Level shifting circuit 842 drives the gate of transistor 802 whether node 801 is at the potential of $V_{DD}$=1.8 volts or $V_{P1}$=12.8 volts. During power up of charge pump 302, $V_{P1}$ is pumped from 1.8 volts to 12.8 volts. Level shifting circuit 842 is operational throughout this range, which prevents floating nodes that can result in excess breakdown voltages across transistors 850–866 or can cause memory cell 30 to be modified incorrectly.

The gates of transistors 854–860 are biased to $V_{P2}$ to protect transistors 850–852 and transistors 862–864 from breakdown. Transistors 850–852 are cross-coupled to provide positive feedback for increased noise immunity and switching speed. Transistor 866 forces latching transistors 850 and 852 to be set to a known state in order to ensure that $V_{CG}$ is in a read state (1.8 volts) when charge pumps 302 and 308 are not operating and $V_{P1}$=1.8 volts.

If $V_{P1}$ reaches 12.8 volts before $V_{P3}$ transitions to 5.5 volts, transistors in level shifting circuit 842 could be damaged. Therefore, $V_{P3}$ is enabled before $V_{P1}$ reaches full potential. For example, $V_{P3}$ is enabled when $V_{P1}$ reaches 7.0 volts. The delay in generating $V_{P3}$ ensures continual operation of level shifting circuit 842 by controlling the voltages applied to transistors 850–866 as high voltages are applied.

Operation of level shifting circuit 842 is shown in the voltage table of Table 5.

TABLE 5

| SIGNAL | READ MODE (charge pumps on/off) | ERASE MODE | PROGRAM MODE |
|---|---|---|---|
| $V_{P1}$ | 1.8 | 13.0 | 13.0 |
| $V_{P3}$ | 0.0 | 5.5 | 5.5 |
| $V_{ERASE}$ | 0.0 | 0.0 | 13.0 |
| node 801 | 1.8 | 13.0 | 1.8 |
| node 851 | 1.8 | 13.0 | 5.5 |
| node 855 | 1.8 | 13.0 | 0.0 |
| HVENABLEP | 0.0 | 1.8 | 0.0 |

Figure 13:
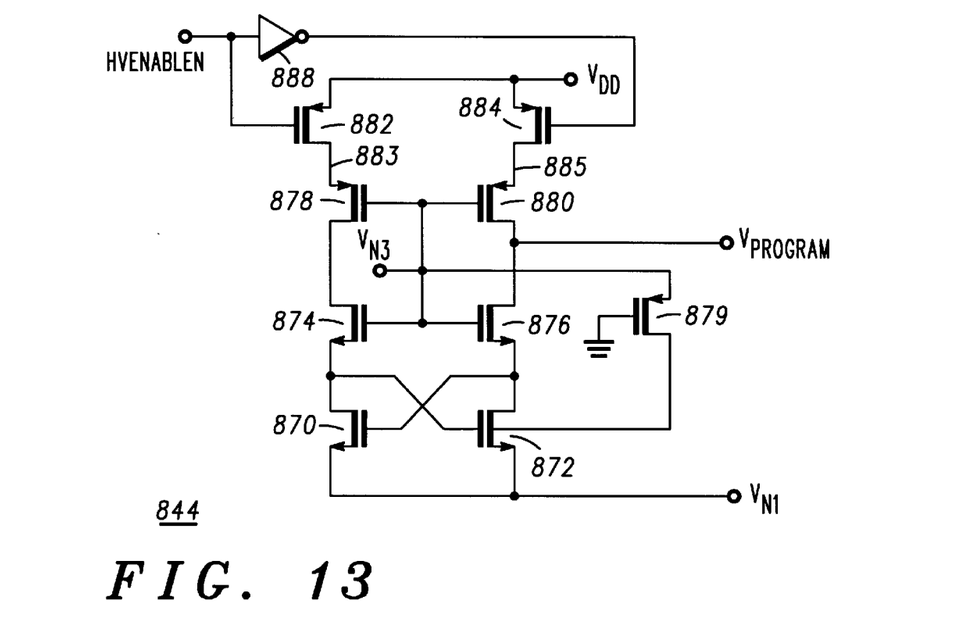
FIG. 13 is a schematic diagram of another level shifting circuit.

FIG. 13 is a schematic diagram of level shifting circuit 844 operating between $V_{N1}$ and ground for level shifting the erase enable signal HVENABLEN referenced to ground to produce switching signal $V_{PROGRAM}$ referenced to $V_{N1}$. Level shifting circuit 844 includes transistors 870–884 and an inverter 888. During power up of charge pump 308, $V_{N1}$ can have a voltage between zero and −9.0 volts. Level shifting circuit 844 is operational throughout this range, which is important for avoiding floating nodes that can produce excess breakdown voltages across transistors in level shifting circuit 844 or can cause memory cell 30 to be modified incorrectly.

The gates of transistors 874–880 are biased to $V_{N3}$ to limit the voltage applied to transistors 870–872 and transistors 882–884. Transistors 870–872 are cross-coupled to provide positive feedback for increasing noise immunity and switching speed. Transistor 879 forces latching transistors 870 and 872 to be set to a known state in order to ensure that $V_{CG}$ is in a read state (1.8 volts) when charge pumps 302 and 308 are not activated.

If $V_{N1}$ reaches −9.0 volts before $V_{N3}$ transitions to −5.0 volts, transistors in level shifting circuit 844 could be damaged. Therefore, $V_{N3}$ is enabled before $V_{N1}$ reaches full potential. For example, $V_{N3}$ is enabled when $V_{N1}$ reaches −7.0 volts. The delay in generating $V_{N3}$ ensures continual operation of level shifting circuit 844 by controlling the voltages applied to transistors 870–884 as high voltages are applied.

Operation of level shifting circuit 844 is shown in the voltage table of Table 6.

TABLE 6

| SIGNAL | READ MODE (charge pumps on/off) | ERASE MODE | PROGRAM MODE |
|---|---|---|---|
| $V_{N1}$ | 1.8 | 13.0 | 13.0 |
| $V_{N3}$ | 1.8 | −5.0 | −5.0 |
| $V_{PROGRAM}$ | 0.0 | −9.0 | 1.8 |
| node 883 | 1.8 | 1.8 | −5.0 |
| node 885 | float | −5.0 | 1.8 |
| HVENABLEN | 0.0 | 0.0 | 1.8 |

Figure 14:
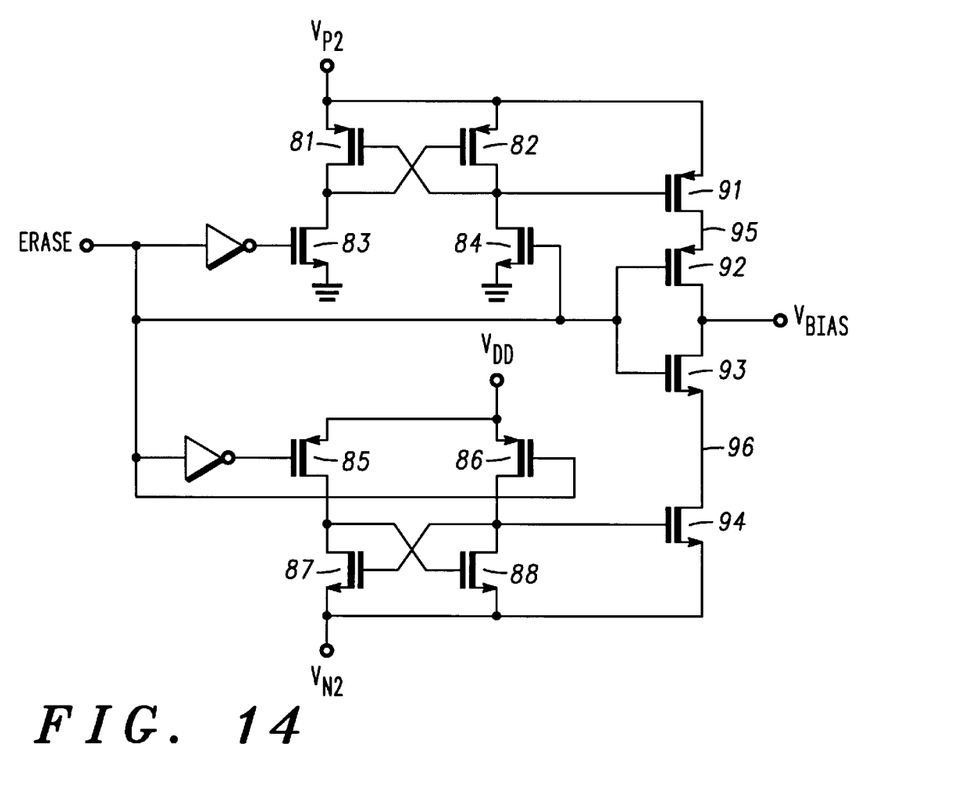
FIG. 14 is a schematic diagram of yet another level shifting circuit.

FIG. 14 is a schematic diagram of bias generator 843 including transistors 81–88 and 91–94 and inverters 89 and 90. Transistors 81–84 comprise a level shifter coupled between $V_{P2}$ and ground potential for switching transistor 91 in response to ERASE. Transistors 81–82 are cross coupled to increase switching speed and noise immunity. Transistors 85–88 comprise a level shifter coupled between ground and $V_{N2}$ for switching transistor 94 in response to ERASE. Transistors 87–88 are cross coupled to increase switching speed and noise immunity.

An output stage comprising transistors 91–94 is coupled between $V_{P2}$ and $V_{N2}$, which could cause device damage under transient conditions. Therefore, the output stage is implemented in a cascode configuration to protect the devices. ERASE drives the gates of transistors 92–93 and operates at 0.0 and 1.8 volt logic levels. Bias generator 843 operates whether or not charge pumps 302 and 308 are active.

Bias generator 843 produces a cascode bias voltage $V_{BIAS}$ for driving transistors 802–808 of row driver 26. $V_{BIAS}$ follows the voltage applied to nodes 801 and 809 of row driver 26 to protect transistors 802–808. That is, when $V_{P1}$=12.8 volts is routed to node 801, $V_{BIAS}=V_{P2}$=5.5 volts. When $V_{N1}$=−9.0 volts is routed to node 809, $V_{BIAS}=V_{N2}$=−5.0 volts. Operating voltages for bias generator 843 under different operating conditions are shown in Table 7.

TABLE 7

| SIGNAL | READ MODE (Charge pumps on/off) | ERASE MODE | PROGRAM MODE |
|---|---|---|---|
| $V_{P2}$ | 1.8/5.5 | 5.5 | 5.5 |
| $V_{N2}$ | 0.0/−5.0 | −5.0 | −5.0 |
| $V_{BIAS}$ | 0.0/−5.0 | 5.5 | −5.0 |
| node 95 | $V_{P2}$/0.0 | 5.5 | 0.0 |
| node 96 | 0.0/−5.0 | 5.5 | −5.0 |
| ERASE | 0.0 | 1.8 | 0.0 |

As shown in Table 7, $V_{BIAS}$ moves up to 5.5 volts in erase mode and down to −5.0 volts in programming mode along with the voltages on nodes 801 and 809. As a result, voltages ranging from 13.0 volts to −9.0 volts to be applied to memory cell 30 while still protecting transistors 802–808 by limiting the voltage across the stack to a maximum of eleven volts.

In summary, it can be seen that the present invention provides a structure and method for modifying data stored in a storage element of a memory circuit when such modification is achieved using high voltages that exceed the breakdowns of transistors of the memory circuit. A routing circuit receives first and second supply voltages and selects between the first and second supply voltages in response to a first control signal to produce a first selected voltage. A switching circuit is controlled by a second control signal which is referenced to the first selected voltage. The switching circuit passes the first selected voltage to the storage element to modify the data when the first supply voltage is selected by the routing circuit.

What is claimed is:

1. A memory circuit, comprising:
   a storage element for storing data;
   a charge pump having a first input coupled for receiving a first voltage to produce a first pumped voltage at an output;
   a first routing circuit having first and second cascode switches respectively coupled for selecting between the first voltage and the first pumped voltage in response to a first control signal to produce a first selected voltage at an output; and
   a first switching circuit operating in response to a second control signal for passing the first selected voltage to the storage element to alter the data.

2. The memory circuit of claim 1, wherein the first cascode switch includes:
   a switching transistor operating in response to the first control signal and having a first conduction electrode coupled for receiving the first voltage; and
   a cascode transistor having a control electrode biased to a first bias voltage to form a conduction path between a second conduction electrode of the switching transistor and the output of the first routing circuit.

3. The memory circuit of claim 2, wherein the second cascode switch includes:
   a switching transistor operating in response to the first control signal and having a first conduction electrode coupled for receiving the first pumped voltage; and
   a cascode transistor having a control electrode biased to the first bias voltage to form a conduction path between a second conduction electrode of the switching transistor and the output of the first routing circuit.

4. The memory circuit of claim 3, further comprising:
   a voltage monitor having a terminal coupled for receiving the first pumped voltage and generating a first enable signal as the first pumped voltage reaches a predetermined level; and
   a voltage generator operating in response to the first enable signal and having an output for developing the first bias voltage from the first pumped voltage.

5. The memory circuit of claim 4, wherein the first switching circuit includes:
   a switching transistor having a control electrode coupled for receiving the second control signal and a first conduction electrode coupled for receiving the first selected voltage; and
   a cascode transistor having a control electrode coupled for receiving a second bias voltage for providing a conduction path between a second conduction electrode of the switching transistor and an output of the first switching circuit.

6. The memory circuit of claim 5, further comprising a bias generator having an input terminal for receiving the first bias voltage and an output for developing the second bias voltage.

7. The memory circuit of claim 6, further comprising:
   a second charge pump activated with the first enable signal for providing a second pumped voltage;
   a second routing circuit having first and second cascode switches coupled to an output of the second routing circuit for selecting between a second voltage and the second pumped voltage in response to a third control signal to produce a second selected voltage; and
   a second switching circuit operating in response to a fourth control signal for passing the second selected voltage to the storage element to alter the data.

8. The memory circuit of claim 1, further comprising a level shifter having an input coupled for receiving a third control signal and an output for providing the first control signal referenced to the first pumped voltage.

9. The memory circuit of claim 1, wherein the first charge pump receives an activation signal having a first value for producing a first magnitude of the first pumped voltage or a second value for producing a second magnitude of the first pumped voltage that is equal to a magnitude of the first voltage.

10. A wireless communications device, comprising:
   a receiver circuit having an input coupled for receiving a radio frequency carrier signal and an output for producing digital data;
   a digital processing circuit for processing the digital data and producing an output signal;
   a memory circuit for storing and transferring data to the digital processing circuit, where the memory circuit includes
   (1) a storage element;
   (2) a charge pump coupled for receiving a first voltage to produce a pumped voltage at an output;
   (3) a routing circuit having first and second cascode switches coupled for selecting between the first voltage and the pumped voltage in response to a first control signal to produce a selected voltage at an output; and
   (4) a switching circuit operating in response to a second control signal for passing the selected voltage to the storage element to alter the data.

11. The wireless communications device of claim 10, wherein the routing circuit includes:
   a first switching transistor operating in response to the first control signal and having a first conduction electrode coupled for receiving the first voltage;

a second switching transistor operating in response to the first control signal and having a first conduction electrode coupled for receiving the pumped voltage;

a first cascode transistor having a control electrode biased to a bias voltage and a conduction path coupled between a second conduction electrode of the first switching transistor and the output of the routing circuit; and a second cascode transistor having a control electrode biased to the bias voltage and a conduction path coupled between a second conduction electrode of the second switching transistor and the output of the routing circuit.

12. The wireless communications device of claim 10, wherein the memory circuit further comprises:

a voltage monitor having a terminal coupled for receiving the first pumped voltage and generating an enable signal as the pumped voltage reaches the predetermined level; and a voltage generator operating in response to the enable signal and having an output for developing the bias voltage from the pumped voltage.

13. The wireless communications device of claim 10, wherein the switching circuit includes:

a switching transistor having a control electrode coupled for receiving the second control signal and a first conduction electrode coupled for receiving the selected voltage; and a cascode transistor having a control electrode coupled for receiving a bias voltage for providing a conduction path between a second conduction electrode of the switching transistor and an output of the switching circuit.

14. A method of modifying data stored in a memory circuit, comprising the steps of:

charge pumping a first voltage to produce a pumped voltage;

biasing first and second cascode switches to a first bias voltage;

selecting between the first voltage and the pumped voltage with a first control signal to route the first voltage through the first cascode switch or the pumped voltage through the second cascode switch to provide a selected voltage;

passing the selected voltage to a storage element of the memory circuit in response to a second control signal to modify the data.

15. The method of claim 14, further comprising the step of:

monitoring the pumped voltage to generate an enable signal as the pumped voltage reaches a predetermined level; and generating the first bias voltage from the pumped voltage in response to the enable signal.

16. The method of claim 15, further comprising the steps of:

developing a second voltage from the pumped voltage in response to the enable signal; and switching the second voltage with a third control signal to produce the first bias voltage.

17. The method of claim 14, wherein the step of passing includes the steps of:

cascading a first transistor with a second bias voltage; and switching the selected voltage through the first transistor to the storage element with the second control signal.

* * * * *